(12) United States Patent
Elran

(10) Patent No.: US 8,810,284 B2
(45) Date of Patent: Aug. 19, 2014

(54) VOLTAGE AND TEMPERATURE COMPENSATED FREQUENCY CONVERTER

(71) Applicant: Tomer Elran, Petah tikva (IL)

(72) Inventor: Tomer Elran, Petah tikva (IL)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 13/766,583

(22) Filed: Feb. 13, 2013

(65) Prior Publication Data

US 2014/0159776 A1   Jun. 12, 2014

Related U.S. Application Data

(60) Provisional application No. 61/735,912, filed on Dec. 11, 2012.

(51) Int. Cl.
   *H03D 3/00* (2006.01)
(52) U.S. Cl.
   USPC .......................................................... 327/102
(58) Field of Classification Search
   CPC ...................................................... H03L 7/099
   USPC ........................................................ 327/102
   See application file for complete search history.

(56) References Cited

U.S. PATENT DOCUMENTS

| 3,626,204 | A | 12/1971 | Brandon et al. |
| 3,697,781 | A | 10/1972 | McLean |
| 3,965,877 | A | 6/1976 | Adey |
| 4,015,216 | A | 3/1977 | Masuda |
| 4,222,095 | A | 9/1980 | Stein |
| 5,514,988 | A | 5/1996 | Schrader et al. |
| 7,453,311 | B1 | 11/2008 | Hart et al. |
| 7,598,818 | B2 | 10/2009 | Bas et al. |
| 7,816,967 | B1 | 10/2010 | Nagarajan et al. |
| 2003/0038643 | A1 | 2/2003 | Ku |
| 2005/0225383 | A1* | 10/2005 | Li et al. .......................... 329/304 |

FOREIGN PATENT DOCUMENTS

GB    2287594 A    9/1995

OTHER PUBLICATIONS

Invitation to Pay Additional Fees and Partial International Search, dated Mar. 14, 2014, International Application No. PCT/US2013/073665, European Patent Office, The Netherlands.

* cited by examiner

*Primary Examiner* — Daniel Rojas
(74) *Attorney, Agent, or Firm* — Brinks Gilson & Lione

(57) ABSTRACT

A voltage to frequency conversion system may be used in association with clock related applications such as a closed loop oscillator. The voltage to frequency conversion system includes independent current sources that are synchronously operated to generate substantially the same respective output currents under varying temperature and supply voltage conditions. One of the current sources is used to generate a reference voltage, and the other of the current sources is used to charge a capacitor in a predetermined ramp. The capacitor may be selectively charged and discharged based on a frequency of an input signal, and an average of the variable charge voltage of the capacitor may be compared to the reference voltage to generate an analog output signal indicative of frequency.

20 Claims, 8 Drawing Sheets

US 8,810,284 B2

VOLTAGE AND TEMPERATURE COMPENSATED FREQUENCY CONVERTER

PRIORITY

This application claims the benefit of priority from U.S. Provisional Application No. 61/735,912, filed Dec. 11, 2012, which is incorporated by reference.

BACKGROUND

Frequency to voltage converters receive an alternating electrical input signal having a frequency, and provide an analog output voltage that is proportional to the frequency of the electrical input signal.

Some frequency to voltage converters are based on sample and hold mechanisms in which a capacitor is charged during a charging phase. With a sample and hold frequency to voltage converters the higher the frequency becomes, the less the capacitor charges resulting in a corresponding decreasing output voltage. The output voltage may also be linearly correlated with a charging current, which can be voltage and temperature dependent. Parasitic capacitance noise generated by the sampling mechanism may also be linearly correlated with the output voltage.

Thus, neither of these approaches is suitable for high accuracy clock designs.

SUMMARY

A frequency to voltage converter system is disclosed that operates to provide high accuracy conversion of a frequency of an electrical input signal to a corresponding voltage level of an analog output signal. The system includes a first current source and a second current source that independently operate to synchronously provide respective electrical currents that remain substantially equal in magnitude. A converter circuit included in the frequency to voltage converter system receives an input signal having a frequency. The converter circuit uses the first and second current sources to generate an analog output signal having a magnitude corresponding to the frequency. The system provides increase accuracy and jitter control by decoupling frequency conversion from variations in temperature and supply voltage.

The converter circuit may include a charge/discharge circuit and a reference circuit. The first current source may supply a first electrical current to the charge/discharge circuit, and the second current source may supply a second electrical current to the reference circuit. The charge/discharge circuit may use the first electrical current to selectively charge and discharge a capacitor included in the charge/discharge circuit based on the frequency of the electrical input signal. The reference circuit may generate a reference voltage using the second electrical current. The first and second current sources may substantially synchronously supply respective electrical currents of substantially equal magnitude to the charge/discharge circuit and the reference circuit. During operation, the electrical currents may remain substantially equal in magnitude due to temperature variations and supply voltage variations having a substantially equal effect on the respective first and second current sources. Accordingly, the system compensates for changes in supply voltage and temperature without the use of voltage or temperature compensation circuits.

A comparator circuit included in the converter circuit may generate an analog output signal indicative of the frequency of the input signal based on comparison of the reference voltage to a voltage of the capacitor. The voltage of the capacitor may be a filtered voltage generated as an average of a charging voltage of the capacitor as the charging voltage of the capacitor varies based on the frequency of the input signal. Since the system performs comparison of voltages, dependency on current to generate the analog output signal is avoided.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE PRESENTLY PREFERRED EMBODIMENTS

Figure 1:
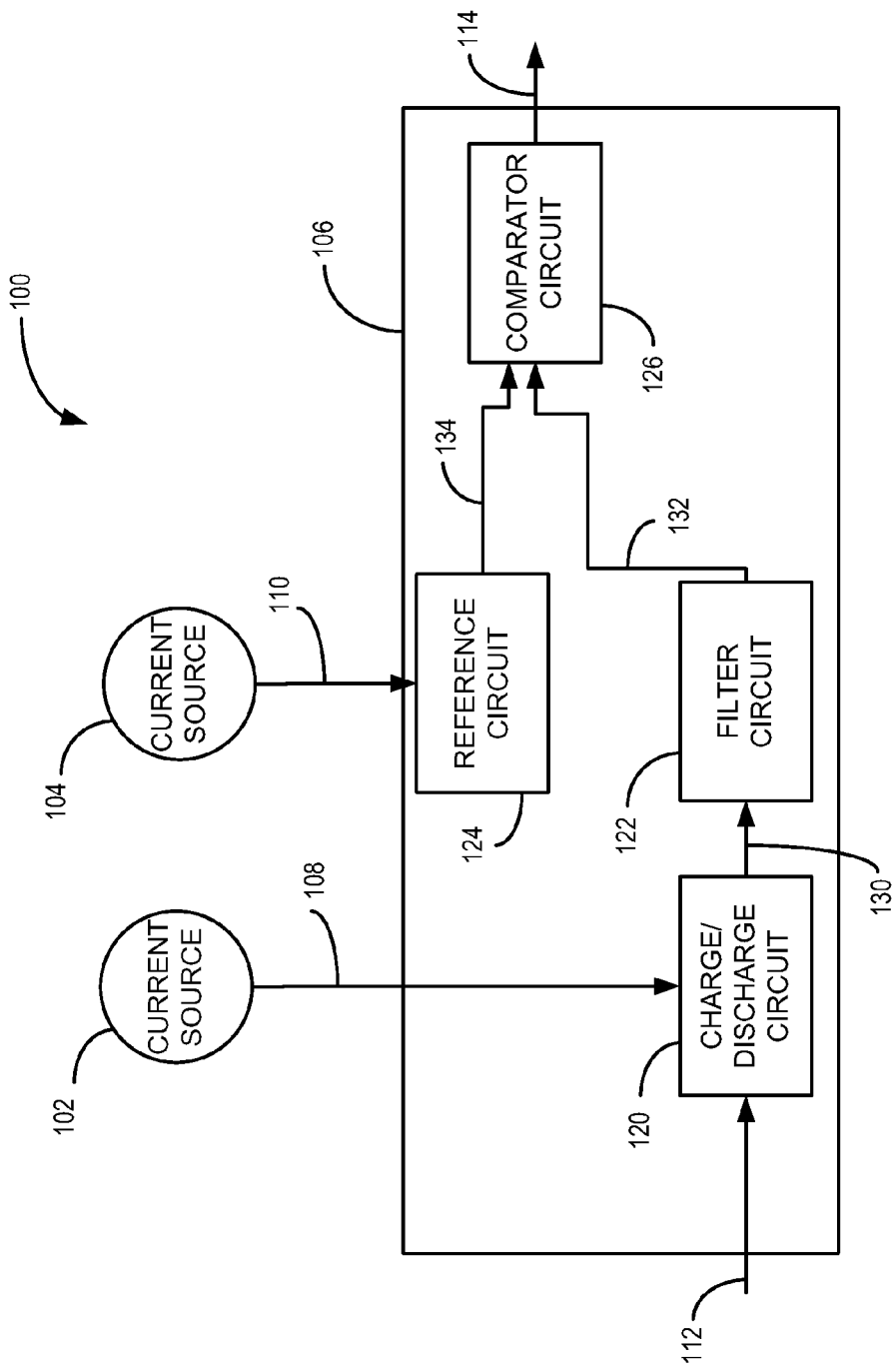
FIG. 1 is a block diagram of an example frequency to voltage converter.

FIG. 1 is an example block diagram of a frequency to voltage converter system 100. The frequency to voltage converter system 100 includes a first current source 102 and a second current source 104. The first and second current sources 102 and 104 may be separate and independent sources of electrical current that operate substantially synchronously to output separate and independent output currents to a converter circuit 106. The first current source 102 may output a first current on a first current supply line 108, and the second current source 104 may output a second current on a second current supply line 110. Since the first and second current sources 102 and 104 operate synchronously, the first and second currents remain substantially equal as different parameters, such as temperature and supply voltage varies.

In one example, the first and second current sources 102 and 104 may be formed in a single substrate as substantially identical current mirrors. In this configuration the first and second current sources 102 and 104 may be supplied by a single supply voltage, and be subject to substantially identical variations in temperature, and any other variable parameters. Accordingly, the first and second currents output by the first and second current sources may remain substantially identical, even as parameter fluctuations cause fluctuation in the first and second currents. In one example, the first and second currents output by the first and second current sources 102 and 104 remain within about 0.1% of each other. The first and second currents are supplied to the converter circuit 106.

The converter circuit 106 may receive an input signal, such as a clock signal, on an input signal line 112. The input signal may be an alternating input signal, such as a square wave, or a sinusoidal wave, having a frequency. The alternating input signal may be an alternating voltage input signal with a current that may, or may not be alternating. Using the first and second current sources, the converter circuit 106 may generate an output signal on an output signal line 114. The output signal may be an analog signal having a magnitude that corresponds to a frequency of the input signal. Thus, the converter circuit 106 may convert the frequency of the input signal to a corresponding analog output signal.

The converter circuit 106 includes a charge/discharge circuit 120, a filter circuit 122, a reference circuit 124, and a comparator circuit 126. The input signal may be provided on the input line 112 to the charge/discharge circuit 120. The charge/discharge circuit 120 may operate based on the frequency of the input signal to charge and discharge the charge/discharge circuit 122 such that the charge/discharge circuit 120 provides a charge voltage that ranges between a first predetermined voltage (discharged state) and a second predetermined voltage (charged state). The charge/discharge circuit 120 may be charged and discharged using the first current supplied by the first current source 102 on the first current supply line 108. Charging and discharging of the charge/discharge circuit 120 may be such that the charge voltage is a time varying signal that changes, or ramps at a predetermined rate of change in both a positive and a negative direction. In one example, operation of the charge/discharge circuit 120 based on the frequency of the input signal may result in the charge voltage forming a saw tooth waveform. The sawtooth waveform may be provided at a frequency or duty cycle, such as 24 MHz, for example. The charge voltage may be supplied by the charge/discharge circuit 120 to the filter circuit 122 on a charge/discharge voltage line 130.

The filter circuit 122 may receive and filter the charge voltage. In one example, the filter circuit 122 is a low pass filter that receives and filters the charge voltage. Operation of the filter circuit 122 may be at a substantially lower frequency than the frequency of the charge voltage such that the frequency of the charging voltage is ten to twenty times greater than the operating frequency of the filter circuit 122. In some examples, the operational frequency of the filter circuit 122 is 1 to 2 MHz, while the frequency of the saw tooth waveform is about 24 MHz. The filter circuit 122 generates a filter voltage on a filter output line 132. Due to the significantly lower operating frequency, the filter voltage may be an average voltage of the time varying charge voltage. The average filter voltage may remain in a predetermined range. The filter output line 132 may supply the filter voltage to the comparator circuit 126.

The reference circuit 124 may receive the second current supplied on the second current supply line 110 and output a reference voltage on a reference voltage line 134. The reference voltage may be generated based on the second current, and supplied to the comparator circuit 126 on the reference voltage line 134.

The comparator circuit 126 may provide as the output signal a dynamic comparison of the reference voltage to the filter voltage. In one embodiment, the comparator circuit 126 is a difference comparator, and the output signal may represent an indication of a degree of difference between the reference voltage and the filter voltage. The indication may be provided within a predetermined range of values, and in a predetermined format. In one example, a minimum predetermined value of the output signal may be provided by the comparator circuit 126 when the reference voltage and the filter voltage are substantially equal, and a maximum predetermined value of the output signal may be provided when a difference between the filter voltage and the reference voltage is maximum, such as when the filter voltage is about equal to zero and the reference voltage is at a predetermined voltage.

During operation, as the frequency of the input signal on the input signal line 112 varies, the charging voltage and the filter voltage correspondingly vary based on a predetermined rate of change. The reference voltage, on the other hand remains relatively constant. In addition to variations in the frequency of the input signal, operational conditions to which the frequency to voltage converter 100 is exposed may vary. For example, the temperature of the frequency to voltage converter 100 may vary. Alternatively, or in addition, a voltage source providing power to the first current source 102 and the second current source 104 may vary. Since the first and second current sources 102 and 104 operate substantially synchronously, variations in parameters associated with operational conditions, such as temperature and source voltage can substantially equally affect the magnitude of the current output by the respective current sources 102 and 104. Since the output signal is generated by the comparator circuit 126 based on comparison of the voltages generated from currents supplied by the synchronously operating current sources 102 and 104, so long as the variations are duplicated in both the first current source 102 and the second current source 104, the output signal will be substantially unaffected.

Figure 2:
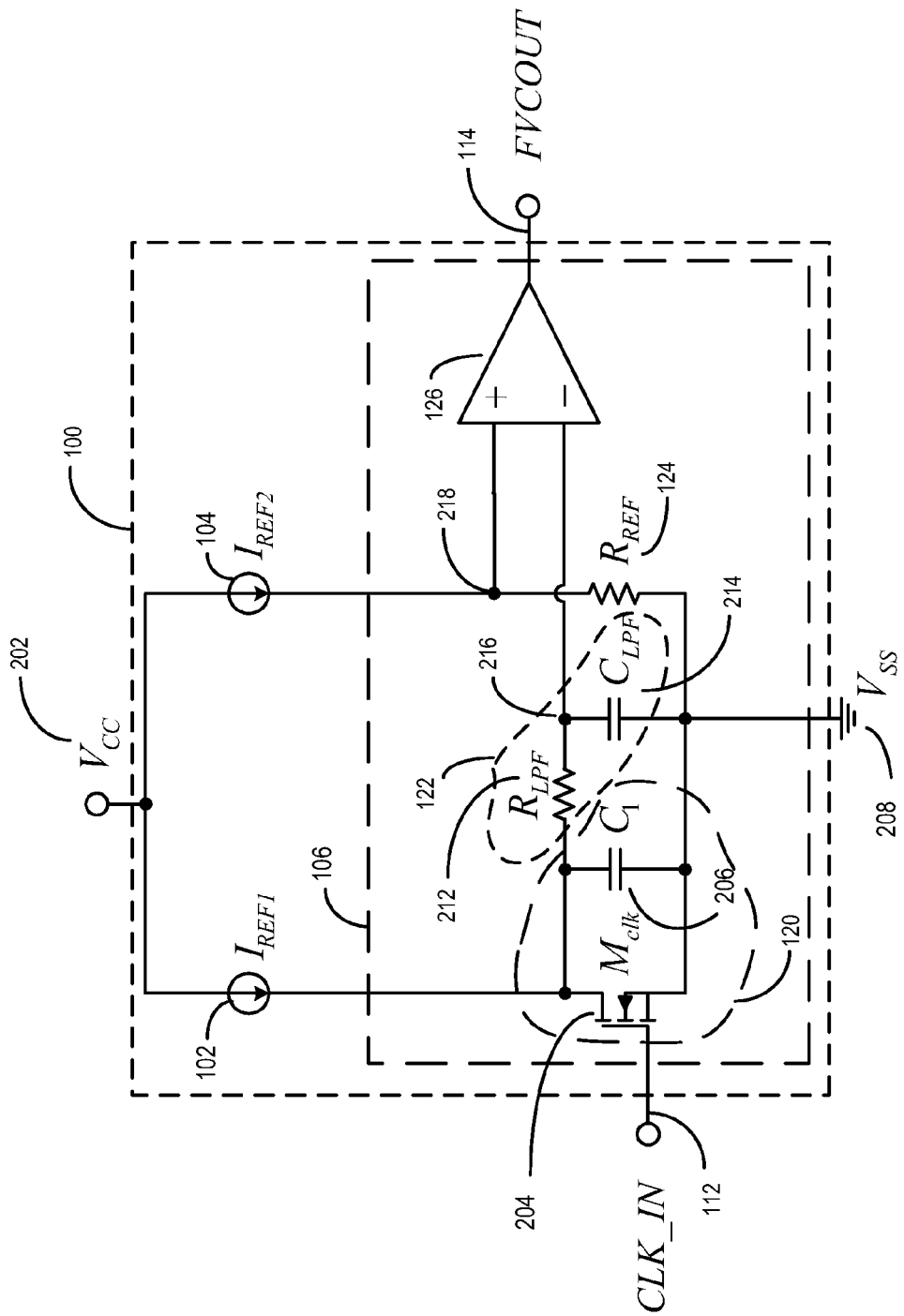
FIG. 2 is an example circuit schematic of a frequency to voltage converter.

FIG. 2 is a circuit schematic of an embodiment of a frequency to voltage conversion system 100, that includes first and second current sources 102 and 104, a converter circuit 106, a charge/discharge circuit 120, a filter circuit 122, a reference circuit 124, and a comparator circuit 126. A voltage source (Vcc) 202 may supply substantially the same predetermined voltage to the first and second current sources 102 and 104. An input signal (CLKIN) may be provided on the input line 112, resulting in a frequency to voltage converted output signal (FVCOUT) on the output line 114.

In FIG. 2, the charge/discharge circuit 120 includes a switch (Mclk) 204, and a capacitor (C1) 206. The switch 204 may be a transistor, such as a MOSFET transistor, or any other form of device operational at a relatively high frequency to transition between a conducting and a non-conducting state. The capacitor 206 may be a metal capacitor, or any other form of capacitor whose resistance and/or other operational characteristics are substantially independent of variations in temperature. The capacitor 206 may be selectively charged by current from the first current source 102, and discharged to a ground potential (Vss) 208 based on the state of the switch 204. When the switch 204 is in a non-conducting state, electrical current from the first current source 102 can flow into the capacitor 206, thereby charging the capacitor 206. Alternatively, when the switch 204 is conducting, current can flow through the switch 204 to ground 208, instead of to the capacitor 206, thereby allowing the capacitor 206 to discharge to ground 208.

Transition of the switch 204 between the conducting and the non-conducting state may be controlled by the duty cycle of the input signal (CLK_IN). When the input signal is in a first predetermined state such as about 1.2 volts, the switch 204 may be conducting, and when the input signal is in a second predetermined state, such as about 0 volts, the switch 204 may be non-conducting. Thus, as the magnitude of the alternating input signal varies at a frequency, the switch 204 may correspondingly transition between the conducting and non-conducting state at the frequency provided by the variation in the input signal. As a result of these transitions, a saw-tooth waveform may be formed.

In this embodiment, the filter circuit 122 includes a resistor (Rlpf) 212, and a filter capacitor (Clpf) 214 configured to operate as a filter, such as a low pass filter to provide an average voltage output. In other embodiments, other configurations may be used to generate an average voltage output based on an input signal have a variable frequency. A capacitor voltage present on the capacitor 206 may be filtered by the filter circuit 122 to create a filtered voltage representing an average of the variable capacitor voltage of the capacitor 206. The filtered voltage, representing an average of the variable capacitor voltage of the capacitor 206, may be present at a filtered voltage node 216 as a voltage (Vclpf). The filtered voltage (Vclpf), which is the voltage on the filter capacitor Clpf 214, may be provided as an input voltage to the comparator circuit 126. In some embodiments, the low-pass filter 122 can be appropriately sized to inject very little high frequency noise in the filtered voltage Vclpf.

The reference circuit 124 of this embodiment includes a resistor (Rref). The resistor (Rref) provides a predetermined substantially constant voltage (Vref) due to the current supplied by the second current source 104 at a reference voltage node 218. In other examples, other configurations of the reference circuit 124 may be used to create the reference voltage (Vref) based on the second current source 104. In the illustrated embodiment, reference voltage Vref may be determined by:

$$Vref = Iref2 * Rref \qquad \text{Equation 1}$$

where Iref2 is the magnitude of current supplied by the second current source 104 and Rref is the resistance of the resistor (Rref) included in the reference circuit 124.

The comparator circuit 126 may be formed with a difference comparator that compares two voltages, such as an operational amplifier differential comparator. The difference comparator may generates an analog output on the output signal line 114 based on a difference between the filter voltage (Vclpf) present at the filtered voltage node 216, and the reference voltage (Vref) present on the reference voltage node 218. In other example embodiments, other devices or circuits may be used to determine a difference between the filter voltage (Vclpf) and the reference voltage (Vref).

The embodiment of the frequency to voltage conversion system 100 illustrated in FIG. 2 uses two substantially identical current sources (102 and 104), where the first current source 102 selectively charges the capacitor (C1) 206, and the second current source 104 is applied on the resistor (Rref) to create the reference voltage Vref at the node 218. During operation, when in a discharge phase, such as when CLK_IN is at a predetermined high voltage, such as about 1.2V, the capacitor C1 206 is discharging and is pulled down or ramped towards ground (Vss) 208 and the predetermined discharged state. When in a charge phase, such as when the voltage of CLK_IN is at a predetermined low voltage, such as 0V, the capacitor C1 206 is charging using Iref1 current supplied by the first current source 102. As the capacitor C1 206 charges, the capacitor voltage builds up or ramps toward the predetermined charged state and corresponding second voltage, or maximum charge voltage. The maximum charge voltage (Vcl_max) across the capacitor C1 206 may be determined by:

$$Vcl\_max = Tcharge * Iref1 / C1 \qquad \text{Equation 2}$$

where Tcharge is the charge time of capacitor C1 206, and Iref1 is the magnitude of current output by the first current source 102.

In one embodiment, the CLK_IN clock duty cycle or frequency (Fclk) may be a predetermined duty cycle, such as about 50%. In this embodiment, the maximum charge voltage on capacitor C1 206 may be proportional to 1/Fclk. In addition, the filter voltage (Vclpf) at the filtered voltage node 216 (the voltage on capacitor Clpf 214) can also be proportional to 1/Fclk. Thus, the filter voltage (Vclpf) at the filtered voltage node 216 may range between a predetermined maximum filtered voltage and a predetermined minimum filtered voltage in accordance with the charge voltage of the capacitor C1 206. In the example embodiment where the CLK_IN frequency (Fclk) is a square wave form of about a 50% duty cycle, the filtered voltage (Vclpf) may be determined by:

$$Vclpf = Vcl\_max / 4 \qquad \text{Equation 3}$$

where Vcl_max is divided by 4 since the voltage signal on C1 206 is a triangle wave form, and half of each cycle is zero. In other examples the input signal may be non-symmetrical (not a 50% duty cycle), the system can be re-calibrated accordingly by adjusting the resistance of resistor Rref. In general, the filtered voltage (Vclpf) is equal to the integral of Vcl(t) over one clock cycle.

In order to avoid dependency on current for accuracy of the frequency to voltage conversion, the voltage of the capacitor Clpf 214 present at the filtered voltage node 216, and the reference voltage of the reference node Vref 216 may be compared. Since two substantially equal currents are supplied by the first and second current sources 102 and 104, respectively, variability and corresponding inaccuracy that may be introduced into the frequency to voltage conversion is minimized or eliminated.

Another possible inaccuracy introduced in the frequency to voltage conversion may be due to variations in the reference circuit 124 due to temperature. In the embodiment of FIG. 2, variability of the resistance of reference resistor Rref due to variations in temperature may be compensated for since resistance variation due to temperature can be predetermined. Compensation for changes in temperature of the reference resistor Rref may include, for example, linear compensation due to known linear changes in resistance, and parabolic compensation by adding and subtracting small amounts of current to the second electrical current (Iref2).

During operation in a closed loop system as described later with reference to FIG. 3, the filter voltage (Vclpf) may remain about equal to the reference voltage (Vref). Thus based on Equations 1, 2 and 3 at a duty cycle of about 50%:

$$Tcharge * Iref1 / (4 * C1) = Iref2 * Rref \qquad \text{Equation 4}$$

Resulting in:

$$Tcharge = 4 * C1 * Rref \qquad \text{Equation 5}$$

due to the current of the first current source (Iref1) being substantially equal to the current of the second current source (Iref2). Since the frequency (F) of the input signal is:

$$F = 2 / Tcharge,$$

using Equation 5:

$$F = 1 / (2 * C1 * Rref),$$

in a closed loop system, such as the system described with reference to FIG. 3, and the charging time of C1 may be dictated by C1 and Rref Since capacitor C1 206 may be a capacitor with minimum variation due to temperature, such as by being a metal capacitor, one source of possible variation in frequency (F) within the frequency to voltage conversion system may be due to temperature dependency of Rref. Accordingly, one of the only remaining dependencies, namely a predetermined temperature dependency of the Resistor (Rref) can be compensated, as previously discussed, to further optimize accuracy of the frequency to voltage conversion by the system.

Figure 3:
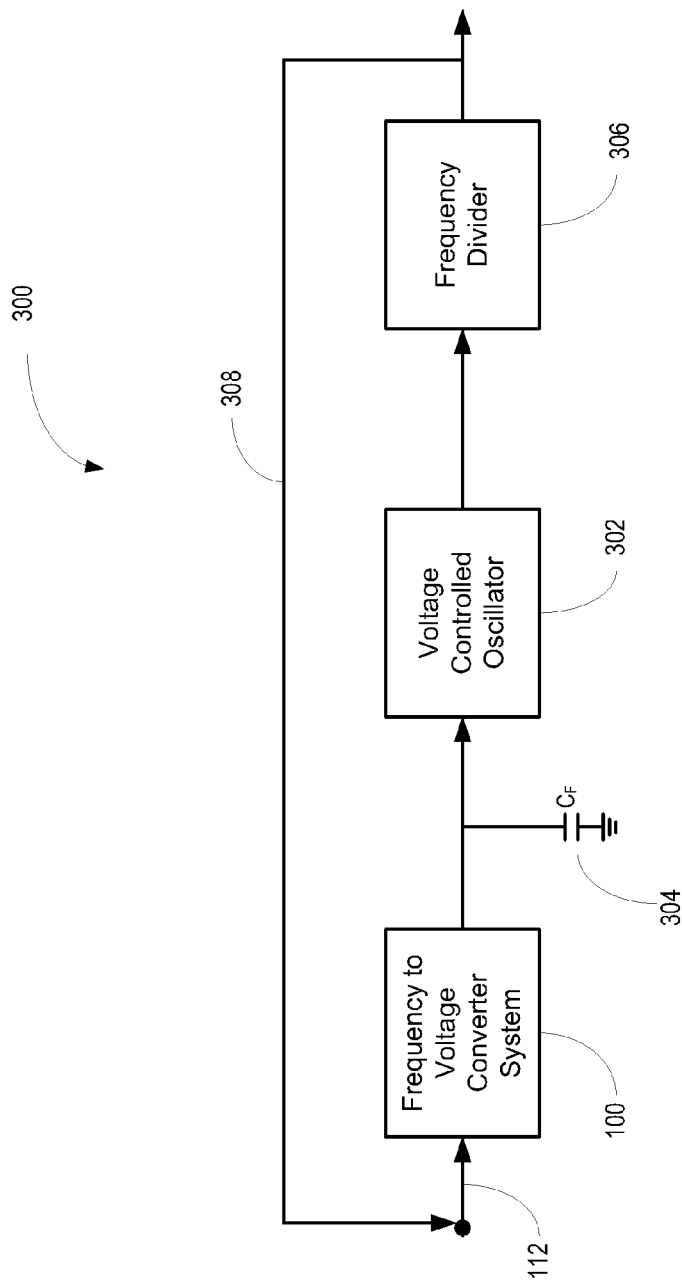
FIG. 3 is a block diagram of an example closed loop oscillator that includes the frequency to voltage converter of FIG. 1.

FIG. 3 is a block diagram of an example closed loop oscillator 300 that includes an embodiment of the frequency to voltage conversion system 100. The closed loop oscillator 300 may generate an accurate clock signal output. In FIG. 3, the frequency to voltage conversion system 100 is integrated in a feedback loop of the closed loop oscillator 300. The closed loop oscillator 300 may be formed as an integrated circuit, such as a monolithic integrated circuit.

In the closed loop oscillator of FIG. 3, the analog voltage output of the frequency to voltage conversion system 100 is provided as an input to a voltage controlled oscillator (VCO) 302. In general, the voltage controlled oscillator 302 may generate square wave form with a variable frequency controlled by the output voltage of the frequency to voltage conversion system 100. Coupled between the frequency to voltage conversion system 100 and the voltage controlled oscillator 302 is a stabilizer circuit 304, which in this embodiment is a capacitor Cf coupled to the ground potential Vss 208. The stabilizer circuit 304 may stabilize the closed loop by stabilizing the output voltage of the frequency to voltage conversion system 100.

The output of the voltage controlled oscillator 302 may be provided to a frequency divider circuit 306. The frequency divider circuit 306 may operate as a shift register or binary counter that receives the output of the voltage controlled oscillator 302 and outputs a clock signal as the output of the closed loop oscillator 300 on a clock output line 308. A feedback line 308 may provide the output clock signal of the closed loop oscillator 300 as the input signal (CLK_IN) to the frequency to voltage conversion system 100 on the input signal line 112.

Figure 4:
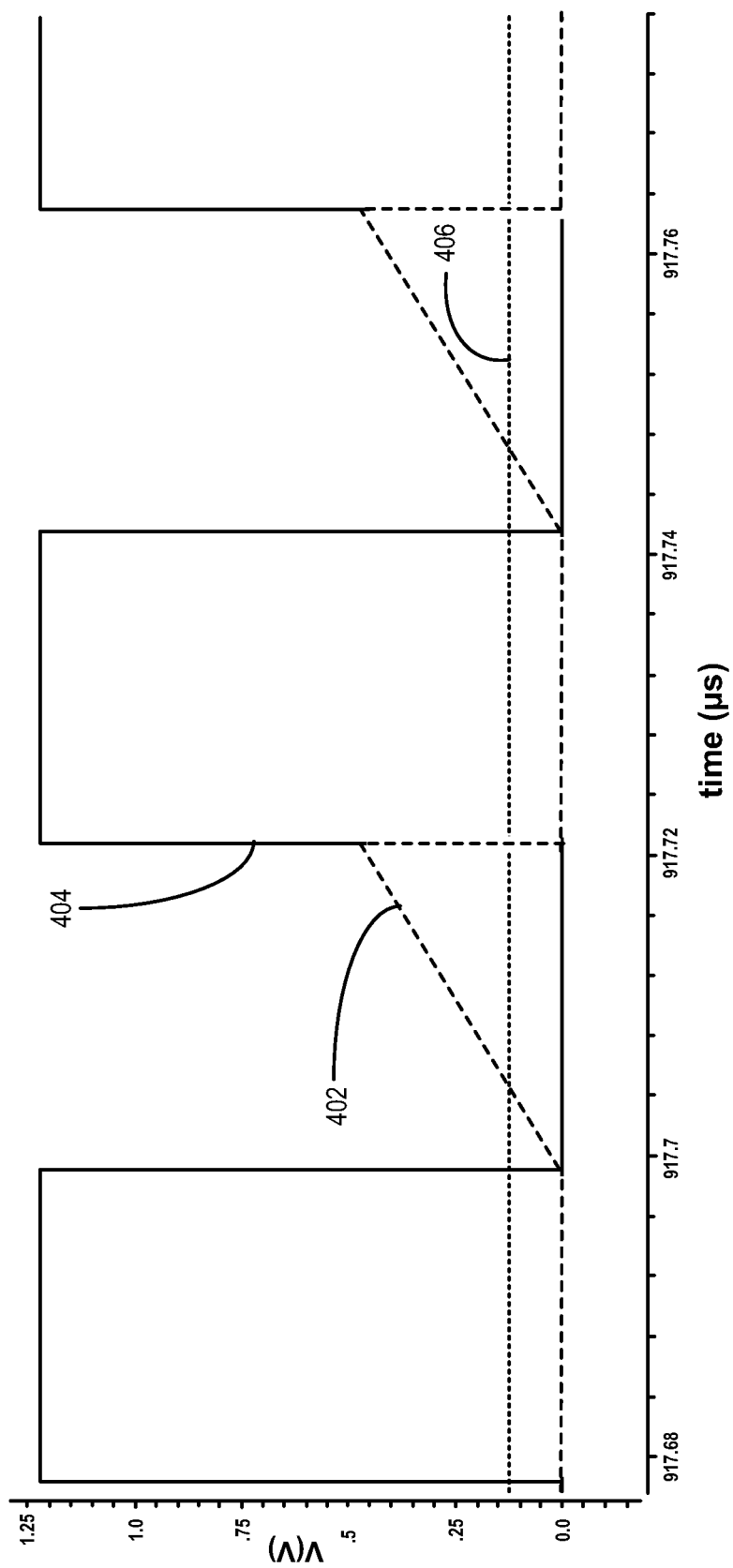
FIG. 4 is a response diagram of a frequency to voltage converter.
Figure 5:
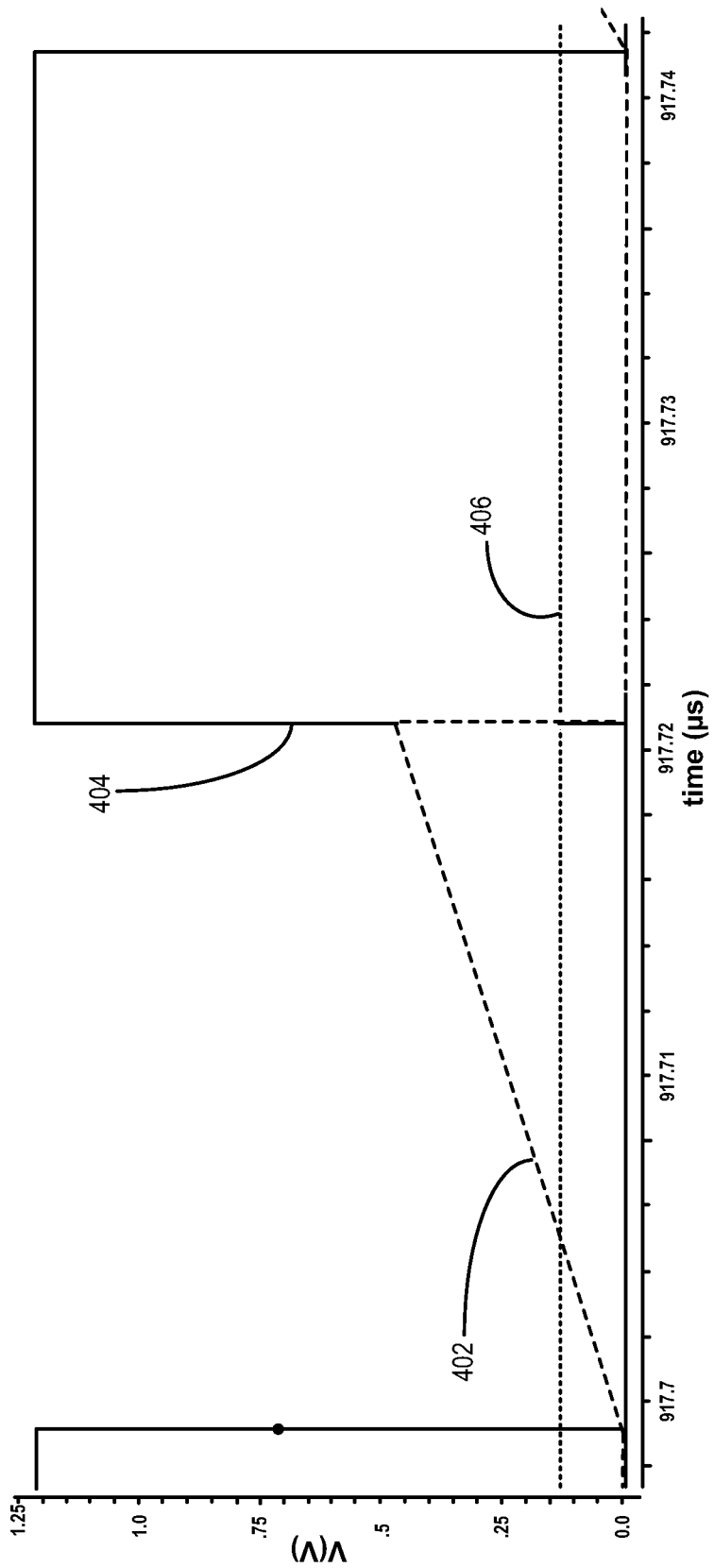
FIG. 5 is a closer view of a cycle of the response diagram of FIG. 4.

FIG. 4 is an example transient response diagram illustrating the relationship of the different voltages during operation of the frequency-to-voltage conversion system 100. Referring to FIGS. 1-4, the charge voltage 402 of the capacitor C1 206 and an input voltage 404 of the input signal (CLK_IN) vary over time (t) in microseconds and voltage magnitude (V). Also illustrated is the reference voltage (Vref) 406 at the reference voltage node 218. FIG. 5 is a close up of the transient response diagram of FIG. 4 illustrating a duty cycle of the input signal 404 and the corresponding portion of the charge and discharge cycle of the capacitor C1 206. As illustrated in the example of FIG. 5, the capacitor C1 206 may charge with the charge voltage 402 at a predetermined ramp lasting for a period of time that is about 0.02 microseconds, and discharge in a substantially smaller period of time.

Figure 6:
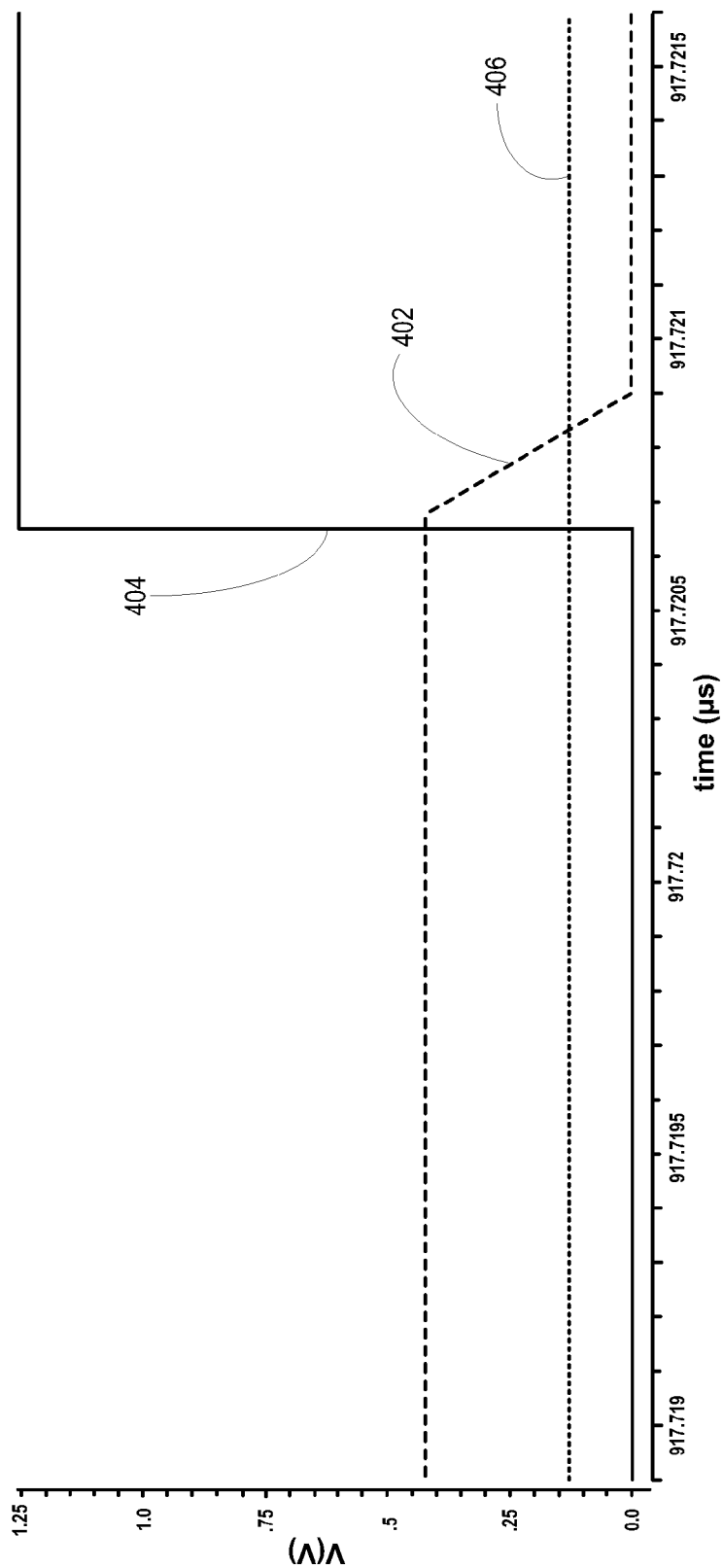
FIG. 6 is a closer view of a capacitor discharge of the response diagram of FIG. 4.

FIG. 6 is a close up of the transient response diagram of FIG. 4 depicting the charge present on capacitor C1 206 during a discharge. In FIG. 6, as the input voltage signal 404 transitions from 0 volts the charge voltage 402 corresponding stops increasing and transitions towards zero volts as the capacitor C1 206 discharges. In the example of FIG. 6, the predetermined discharge time of the capacitor C1 206 is about 2 milliseconds.

Figure 7:
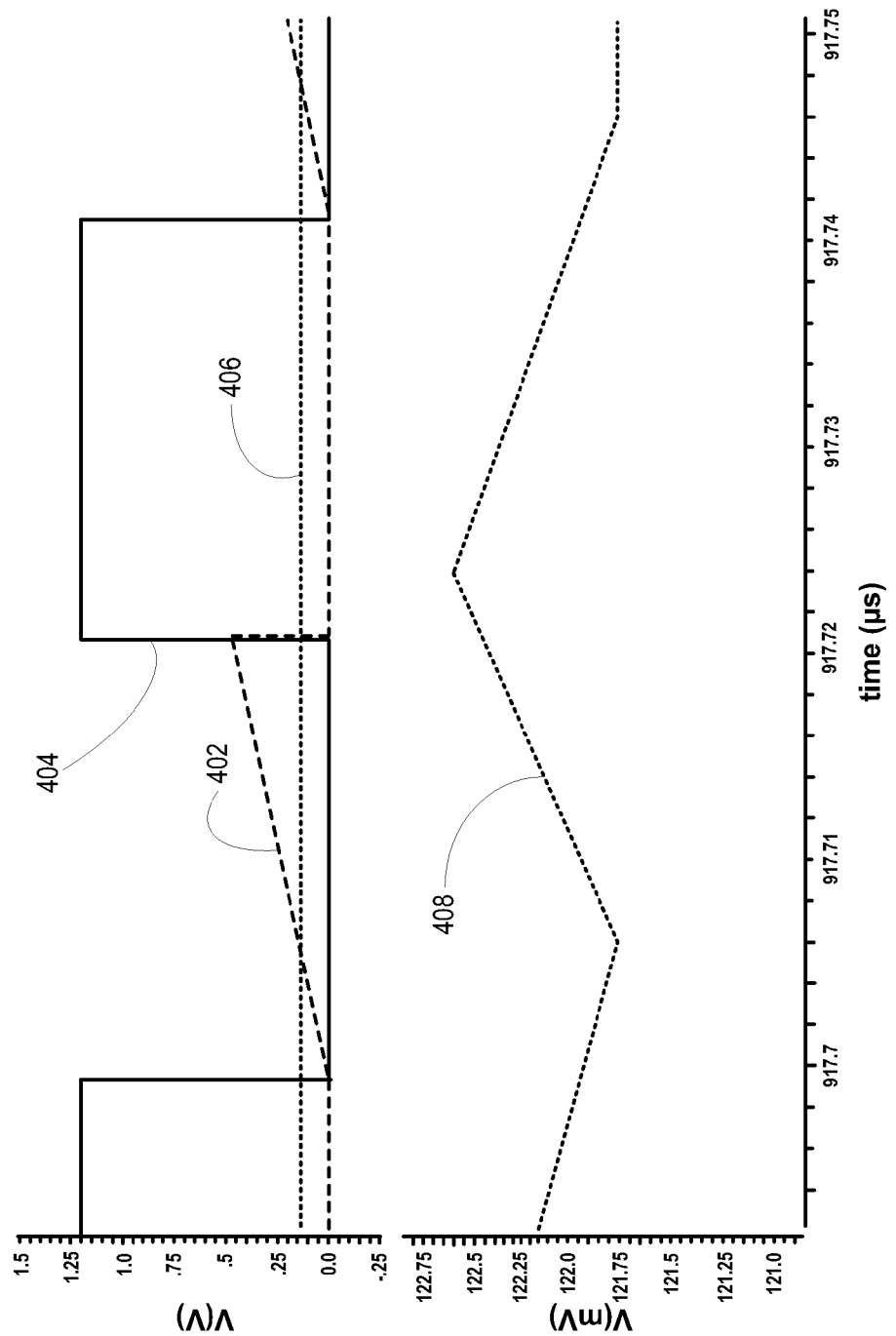
FIG. 7 is a response diagram illustrating a filtered voltage within a portion of response diagram of FIG. 4.

FIG. 7 is an example of a portion of the transient response diagram of FIG. 4, which also depicts behavior of the filtered voltage (Vclpf) 408 present on the filtered voltage node 218. As previously discussed, the filtered voltage (Vclpf) 408 represents an average of the charge voltage 402 due to the filter circuit 122. Accordingly, the filter voltage (Vclpf) 408 is generally a sinusoidal wave form created based on the charge and discharge cycle of the capacitor C1 206, and more specifically, the charge voltage 402. In the example of FIG. 7, the peak-to-peak filter voltage (Vclpf) 408 is about 1 millivolt, whereas the charge voltage is about 0.5 volts. Due to the integration performed by the filter circuit 122, the filter voltage (Vlcpf) continues to increase as the charge voltage 402 first decreases, and the filter voltage (Vlcpf) continues to decrease as the charge voltage 402 first increases.

During operation, the filtered voltage 406 and the reference voltage changes as the current of the second current source 104 and correspondingly, the first current source 102 changes between time t=2.9 microseconds and t=3.053 microseconds. At time t=2.9 microseconds, the charge voltage 402 is at the predetermined discharged state, such as about 0 volts, and the switch (Mclk) 204 is energized (conducting) since the input signal 404 is high at the first predetermined state, such as at about 1.2 volts. Between 2.9 microseconds and about 2.922 microseconds, switch (Mclk) 204 first stops conducting, and then the charge voltage 402 ramps toward the predetermined charged state from about 0 volts to about 0.53 volts, and the filtered voltage 406 increases much more slowly than the charge voltage 402. At t=2.922 microseconds, the input voltage transitions from the first predetermined state of about 0 volts to the second predetermined state of about 1.25 volts, thereby energizing the switch 204. Once the switch 204 is conducting, the charge voltage 402 enters the discharge phase and decreases towards common ground 208 as the capacitor C1 206 discharges. In addition, the filtered voltage 406 decreases much more slowly than the charge voltage 402 towards the common ground 208.

At t=2.945 microseconds, the input voltage 404 cycles from the second predetermined state back to the first predetermined state of about 0 volts, and the switch 204 is deenergized (not conducting). Once the switch 204 is not conducting, the charge voltage 402 again begins to increase to the predetermined charged state, as the capacitor (C1) is charged toward the second voltage. In addition, the filtered voltage 406 begins to increase at a much slower rate toward the predetermined maximum filtered voltage.

Figure 8:
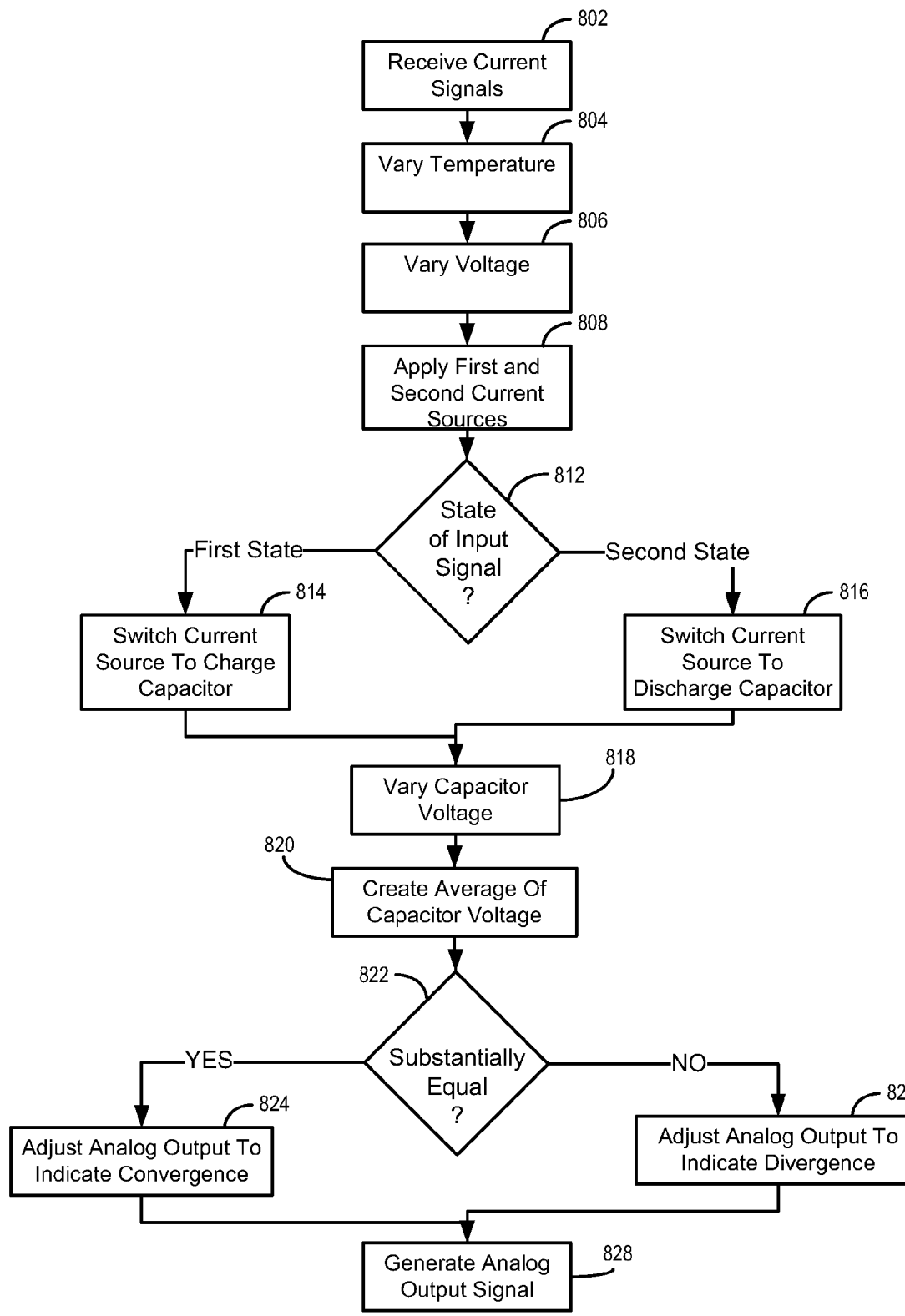
FIG. 8 is an example operational flow diagram of a frequency to voltage converter.

FIG. 8 is an operational flow diagram describing example operation of the frequency to voltage conversion system. With reference to FIGS. 1-4, at block 802, a first electrical current is supplied from the first current source 102, and a second electrical current that is substantially equal to the first current is supplied from the second current source 104. At block 804, the temperature of first and second current sources 102 and 104 are varied and the output current of the first and second current sources 102 and 104 vary substantially synchronously. A voltage supplied to each of the first and second current sources 102 and 104 is varied at block 806 and the output current of the first and second current sources 102 and 104 vary substantially synchronously. At block 808, the first current is supplied to the charge/discharge circuit 102, and the second current is supplied to the reference circuit 124.

At block 812, it is determined if the input signal CLK_IN is at a first predetermined state or a second predetermined state. If the input signal is in the first predetermined state, the capacitor C1 206 included in the charge/discharge circuit 120 may be charged towards a predetermined charged state at block 814. If, on the other hand, the input signal is in the second predetermined state the capacitor C1 206 may be discharged towards a predetermined discharge state at block 816. At block 818, the voltage of the capacitor C1 206 may vary between a minimum charge voltage and a maximum charge voltage dependent on whether the capacitor C1 206 is charging or discharging. A variable average charge voltage of the varying charging voltage of the capacitor C1 206 may be determined at block 820 using, for example, a low pass filter included in the filter circuit 122.

At block 822 the average charge voltage is compared to the reference voltage. If the average charge voltage is approaching a magnitude of the reference voltage, at block 824, generation of an analog output signal may be adjusted to indicate convergence of the average charge voltage and the reference voltage. If, on the other hand, at block 822, the average charge voltage is moving away from the magnitude of the reference voltage, at block 826, generation of the analog output signal may be adjusted to indicate divergence of the average charge voltage and the reference voltage. At block 828, the analog output signal may be output by the voltage to frequency converter system 100, and the operation may return to block 802.

The previously described embodiments of the frequency to voltage conversion system eliminates dependence of the frequency to voltage conversion system on supply voltage and temperature. Elimination of this dependency may be based on maintaining respective independently generated output currents of the first and second current sources substantially in synchronism as the temperature and supply voltage varies. In addition, comparison of a reference voltage generated with the second current source, and an average of a charge voltage of a capacitor that is selective charged and discharged with the first current source based on a duty cycle and frequency of an input signal is used to generate a time varying analog output signal indicative of the frequency of the input signal. Thus, as the frequency of the input signal varies, the analog output signal varies accordingly. Since the frequency to voltage conversion system does not use a sample and hold mechanism, sensitivity to parasitic switching events and noise are minimized.

In the example of using the frequency to voltage conversion system in a closed loop oscillator, temperature changes of between minus 10 degrees Celsius and 85 degrees Celsius may result in the analog output signal representative of frequency varying by plus and minus 270 parts per million (PPM). Thus, over one mHz of clock signal there is 270 Hz of drift. In addition, jitter of the closed loop oscillator over an 18 microsecond period may be equal to plus and minus 250 picoseconds (psec).

It is intended that the foregoing detailed description be understood as an illustration of selected forms that the invention can take and not as a definition of the invention. It is only the following claims, including all equivalents, that are intended to define the scope of this invention.

I claim:

1. A frequency converter device comprising:
a first current source;
a second current source operable independent of the first current source, wherein the first and second current sources are operable synchronously to generate separate independent output currents that remain substantially equal in magnitude; and
a converter circuit configured to receive an input signal having a frequency, the converter circuit operable to use the first and second current sources to generate an analog output signal having a magnitude corresponding to the frequency.

2. The frequency converter device of claim 1, wherein the converter circuit includes a comparator circuit operable to generate the analog output signal based on comparison of a first voltage generated with the input signal and the first current source to a second voltage generated as a reference voltage with the second current source.

3. The frequency converter device of claim 1, wherein the converter circuit includes a charging circuit operable to charge and discharge a capacitor with the first current source in response to the frequency of the input signal, the analog output signal being variable based on a charged state of the capacitor and a reference voltage generated with the second current source.

4. The frequency converter device of claim 3, wherein the converter circuit comprises a low pass filter operable to provide a filtered voltage representative of an average of the charged state of the capacitor, and the analog output signal being variable based on the charged state of the capacitor and the reference voltage.

5. The frequency converter device of claim 4, wherein the converter circuit further comprises a comparator operable to generate the analog output signal based on comparison of the average of the charged state of the capacitor to the reference voltage.

6. The frequency converter device of claim 1, wherein the first current source and the second current source are substantially identical current mirrors formed in a single substrate.

7. A frequency converter device comprising:
a charging circuit operable to charge and discharge a capacitor based on a frequency of an input signal, the capacitor charged and discharged with a first current source;
a reference circuit configured to generate a reference voltage from a second current source, the first and second current sources being substantially identical and independent sources of electrical current; and
a comparator operable to generate an analog output signal indicative of the frequency of the input signal based on comparison of the reference voltage to a voltage of the capacitor.

8. The frequency converter device of claim 7, further comprising a low pass filter coupled with the charging circuit, the low pass filter operable to average the voltage of the capacitor to form a low pass filter voltage, wherein the comparator is operable to compare the average of the low pass filter voltage to the reference voltage to generate the analog output signal.

9. The frequency converter device of claim 7, wherein the charging circuit includes a switch coupled with the capacitor, the capacitor discharged and charged by operation of the switch between a conducting and a non-conducting state based on the frequency of the input signal.

10. The frequency converter device of claim 7, wherein the comparator is a difference comparator, and the first and second current sources remain substantially equal such that the reference voltage and a filtered voltage representative of an average of the voltage of the capacitor become substantially equal as the capacitor approaches a predetermined charged state.

11. The frequency converter device of claim 7, wherein the capacitor is a metal capacitor.

12. The frequency converter device of claim 7, wherein the first current source and the second current source are supplied a same voltage from a common voltage source, and are operable synchronously to generate separate independent output currents that remain substantially equal in magnitude.

13. The frequency converter device of claim 7, wherein the first current source and the second current source are formed in a common substrate and are subject to substantially a same voltage and a same temperature.

14. The frequency converter device of claim 7, wherein the charge and discharge of the capacitor generates a variable clock signal that is averaged to provide the voltage of the capacitor, and the reference circuit includes a resistor to which the second current source is applied to generate the reference voltage.

15. A method of converting a frequency of an input signal to an analog output signal, the method comprising:

receiving an alternating input signal having a frequency;

selectively applying from a first current source a first electrical current to charge a capacitor, the first electrical current selectively applied to the capacitor based on the alternating input signal;

applying from a second current source a second electrical current to a reference circuit;

independently and synchronously supplying the first and second electrical currents to be substantially equal; and generating an analog output signal indicative of the frequency of the alternating input signal based on a voltage of the capacitor and a voltage of the reference circuit.

16. The method of claim 15, wherein selectively applying from a first current source a first electrical current comprises energizing and de-energizing a transistor with the alternating input signal to charge and discharge the capacitor.

17. The method of claim 15, further comprising varying the first and second electrical currents substantially equally as a temperature of the first and second current sources fluctuates.

18. The method of claim 17, further comprising varying the first and second electrical currents substantially equally as a supply voltage to the first and second current sources varies.

19. The method of claim 15, further comprising filtering a saw tooth waveform output of the capacitor with a low pass filter to generate a low pass filter voltage representing an average of the saw tooth waveform; and generating the analog output signal to be indicative of a difference between the low pass filter voltage and the voltage of the reference circuit.

20. The method of claim 15, wherein applying from the second current source the second electrical current to the reference circuit comprises applying the second electrical current to a resistor to create a reference voltage, charging and discharging the capacitor to vary a voltage of the capacitor between a predetermined discharge state and a predetermined charge state, and comparing an average of the variable voltage to the reference voltage to generate the output voltage.

* * * * *